United States Patent [19]

Niikawa et al.

[11] Patent Number: 4,866,326

[45] Date of Patent: Sep. 12, 1989

[54] DRIVER CIRCUIT FOR PIEZOELECTRIC ACTUATOR, AND IMPACT DOT-MATRIX PRINTER USING THE DRIVER CIRCUIT

[75] Inventors: Takeshi Niikawa; Masashi Suzuki, both of Nagoya, Japan

[73] Assignee: Brother Kogyo Kabushiki Kaisha, Nagoya, Japan

[21] Appl. No.: 156,584

[22] Filed: Feb. 17, 1988

[30] Foreign Application Priority Data

Feb. 19, 1987 [JP] Japan .................................. 62-36644
Feb. 19, 1987 [JP] Japan .................................. 62-36645

[51] Int. Cl.[4] .............................................. H01L 41/08

[52] U.S. Cl. .................................... 310/315; 310/316; 310/317

[58] Field of Search ............... 310/315, 316, 317, 319, 310/328, 323

[56] References Cited

U.S. PATENT DOCUMENTS

| | | | |
|---|---|---|---|
| 3,297,889 | 1/1967 | Breskend | 310/315 |
| 4,275,402 | 6/1981 | Kern | 310/315 X |
| 4,352,114 | 9/1982 | Kyogoku | 310/315 X |
| 4,400,705 | 8/1983 | Horike | 310/315 X |
| 4,567,766 | 2/1986 | Seiferling | 310/315 X |
| 4,583,059 | 4/1986 | Konno | 310/315 X |
| 4,595,854 | 6/1986 | Yano et al. | 310/317 |
| 4,608,506 | 8/1986 | Tanuma | 310/317 X |
| 4,660,057 | 4/1987 | Watanabe et al. | 310/315 X |

FOREIGN PATENT DOCUMENTS

| | | | |
|---|---|---|---|
| 57-103854 | 6/1982 | Japan | 310/315 |

*Primary Examiner*—Mark O. Budd
*Attorney, Agent, or Firm*—Oliff & Berridge

[57] ABSTRACT

An impact dot-matrix printer having a print head which includes a piezoelectric element and a print element such as a print wire activated by the piezoelectric element, wherein the print head is movable between a printing area and a non-printing area of the printer. A pressure detector is provided for detecting a printing pressure of the print element. The detector includes a pressure-sensitive element which is disposed in a predetermined position in the non-printing area, in which the print element is operable to act on the pressure-sensitive element. A voltage controller connected to the pressure detector and the piezoelectric element is provided for controlling a voltage applied to the piezoelectric element, based on an output of the pressure detector, such that the printing pressure coincides with a predetermined value. Since the printing pressure is varied with a temperature of the piezoelectric element, the voltage may be controlled based on the temperature of the piezoelectric element detected by a temperature sensor.

5 Claims, 9 Drawing Sheets

FIG.4
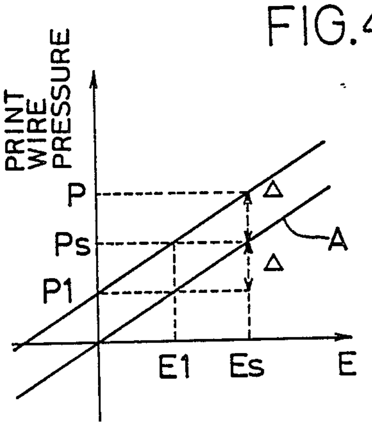
FIG.5
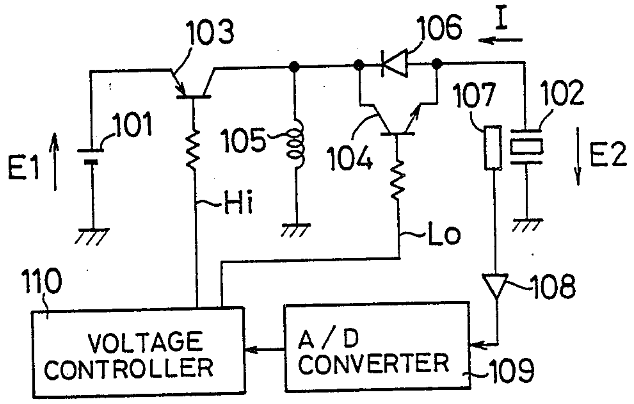
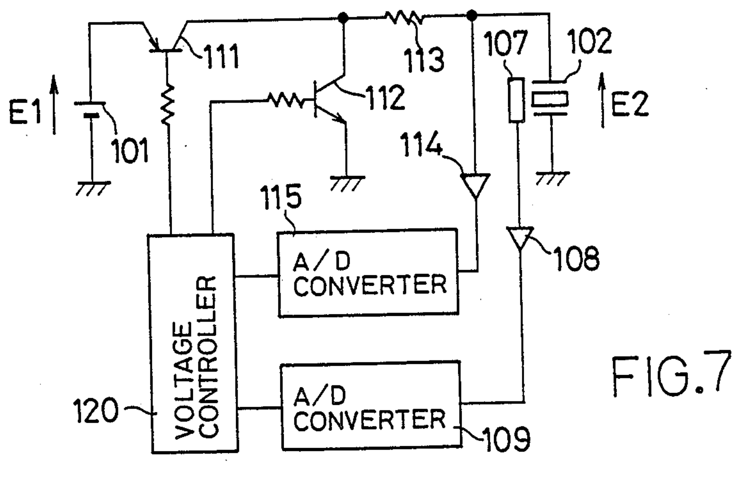
FIG.7

DRIVER CIRCUIT FOR PIEZOELECTRIC ACTUATOR, AND IMPACT DOT-MATRIX PRINTER USING THE DRIVER CIRCUIT

BACKGROUND OF THE INVENTION

1. Field of the Invention

The present invention relates generally to a driver circuit for driving a piezoelectric actuator as used for actuating print wires or other forms of printing elements of an impact dot-matrix printer, and more particularly to such a driver circuit which ensures a reduced amount of a change of the operated position of a piezoelectric element due to variation in the amount of its residual strain o its non-operated position which varies with the temperature.

2. Discussion of the Prior Art

A piezoelectric actuator is known in the art of actuating print wires of an impact dot-matrix printer, or an ink-ejecting mechanism of an ink-jet printer. Such a piezoelectric actuator utilizes its piezoelectric property wherein the application of a voltage across a piezoelectric element causes mechanical deformation or strain thereof, which is amplified by a suitable mechanism, to obtain a necessary amount of actuating stroke.

It is recognized that the amount of strain or deformation, of a piezoelectric element when no voltage is applied thereto, i.e., the amount of its residual strain has a large degree of dependence on the temperature in the negative direction. On the other hand, the amount of deformation or displacement of the operating surface of the piezoelectric element caused by a given voltage is constant. Consequently, the non-operated and operated positions of the piezoelectric element before and after the application of the voltage are changed depending upon the ambient temperature, even though the operating stroke of the element is constant. This is a problem with the piezoelectric actuator.

Where a piezoelectric element is used for an impact or ink-jet dot-matrix printer, therefore, the impact pressure of the print wires or the ink-jet pressure tend to be changed with the temperature of the operating environment, even when the piezoelectric element is energized by a constant voltage. Thus, the printer suffers from inconsistent concentration or density of an ink material which forms a printed pattern of dots, or insufficient printing pressure which leads to printing failure of some dots.

To solve the above problem, it is proposed to attach to a piezoelectric element or an adjacent amplifying element, a suitable metal or other material whose residual strain has dependence on the temperature in the positive direction, so that a change in the amount of strain of such a material due to a variation in the temperature may compensate for a corresponding change in the amount of strain of the piezoelectric element.

The above solution requires the use of a complicated arrangement or difficult adjustment of the amplifying mechanism for the piezoelectric element.

Further, the temperature of the piezoelectric element is affected not only by the ambient temperature, but also by a heat generated due to resistance losses of the element itself or a driver circuit for the element, and a heat due to a mechanical friction of the print wires of a printer. In other words, the temperature of the piezoelectric element is changed largely depending upon an average duty cycle of the element as an actuator which drives the corresponding print wire o ink plunger to print dots at appropriate matrix positions to form printed characters or images. When the temperature variation resulting from this factor is considerable, the known mechanical compensation by using a suitable material as indicated above is not sufficient to completely eliminate the temperature dependency of strain of the piezoelectric element.

SUMMARY OF THE INVENTION

It is therefore a first object of the present invention to provide an impact dot-matrix printer which is capable of compensating operating amounts of piezoelectric elements for their dependence of residual strain on the temperature, and which assures a constant optimum printing pressure, thereby permitting an improved quality of dot-matrix printing.

This first object of the invention may be attained according to one aspect of the present invention, which provides an impact dot-matrix printer having a print head which includes a piezoelectric element and a print element such as a print wire activated by the piezoelectric element, comprising: (a) positioning means for moving the print head between a printing area and a non-printing area of the printer; (b) pressure detecting means for detecting a printing pressure of the print element, the pressure detecting means including a pressure-sensitive element which is disposed in a predetermined position in the non-printing area, in which the print element is operable to act on the pressure-sensitive element; and (c) voltage control means connected to the pressure detecting means and the piezoelectric element, for controlling a voltage applied to the piezoelectric element, based on an output of the pressure detecting means, such that the printing pressure coincides with a predetermined value.

In the impact dot-matrix printer of the present invention constructed as described above, the pressure-sensitive element is disposed within the non-printing area so that the print head moved to the predetermined position in the non-print area faces the pressure-sensitive element. In this predetermined position, the print element is activated by the piezoelectric element, and the operating end of the print wire is brought into abutting contact with the pressure-sensitive surface of the pressure-sensitive element. At this time, the impact pressure of the print element acting on the pressure-sensitive surface is detected by the pressure detecting means. That is, an output of the pressure detecting means represents a printing pressure of the print element that is expected to be produced during a printing operation within the printing area, when the piezoelectric element is driven with the same voltage as used to detect the impact pressure of the print element against the pressure-sensitive surface of the pressure-sensitive element. This detection of the impact pressure by moving the print head to the predetermined position within the non-printing area is effected immediately before the printing operation, and at a predetermined frequency during the printing operation. The voltage control means is adapted to regulate the voltage applied to the piezoelectric element, based on the printing or impact pressure sensed by the pressure detecting means, so that the printing pressure is equal to the predetermined optimum value. As a result, the operated position of the piezoelectric element and consequently the printing pressure of the print element can be maintained at the predetermined constant values, irrespective of the varying temperature of the piezoelectric element. While the non-operated position or amount of residual strain of the piezoelectric element is influenced by the temperature, the operating stroke or displacement of the piezoelectric element between the non-operated and operated positions is adjusted by regulating the voltage applied to the piezoelectric element, according to the detected actual printing pressure of the print element, so that the operated position of the print element can be held constant, irrespective of the temperature of the piezoelectric element. Thus, the instant printer provides improved printing quality.

In one form of the printer of the invention, the pressure detecting means further includes a power source connected to the pressure-sensitive element, a resistor connected between the power source and the pressure-sensitive element, and an amplifier for amplifying a potential across the resistor.

In another form of the invention, the positioning means includes determining means for determining whether a predetermined condition is satisfied, and the positioning means is adapted to automatically move the print head to the predetermined position in the non-printing area, when the predetermined condition is satisfied. In this case, the determining means may be adapted to determine whether the print head has completed printing of a predetermined number of lines. Thus, the determining means is provided to determine the frequency at which the detection and adjustment of the printing pressure is carried out.

In a further form of the present invention, the voltage control means applies a voltage to the piezoelectric element to cause the print element to act on pressure-sensitive element, while the print head is placed in the above-indicated predetermined position in the non-printing area of the printer. The voltage control means operates to change the voltage until the printing pressure detected by the pressure detecting means coincides with the predetermined value. The voltage control means stores a voltage corresponding to the predetermined optimum printing pressure, and applies this voltage to the piezoelectric element during a printing operation.

In a still further form of the invention, the voltage control means stores data representative of a standard relationship between the printing pressure and the voltage at a given temperature, and determines a voltage corresponding to the predetermined value of the printing pressure, based on a difference between the predetermined value, and the actual value detected by the pressure detecting means with a given voltage applied to the piezoelectric element, and according to the standard relationship.

A second object of the invention is to provide a driver circuit for driving a piezoelectric element, such that the operated position of the piezoelectric element is not influenced by the temperature due to a variation of the non-operated position which varies with the temperature.

The above second object may be attained according to another aspect of the present invention, which provides a driver circuit for driving a piezoelectric element, comprising: (a) a DC power source and a switching element for charging the piezoelectric element in response to a control signal; (b) a temperature sensor for detecting a temperature of the piezoelectric element; and (c) voltage control means for controlling the control signal applied to the switching element, according to the temperature of the piezoelectric element detected by the temperature sensor, such that a voltage applied to the piezoelectric element is changed so that an operated position of the piezoelectric element with the voltage applied thereto is held constant, irrespective of a non-operated position of the piezoelectric element which varies with the temperature thereof.

Where a print element of a dot-matrix printer is driven by a piezoelectric element, for example, the printing pressure of the print element can be held constant irrespective of the temperature of the piezoelectric element, if the amount of piezoelectric displacement of the operating surface of the piezoelectric element is controlled so that the operated position of the operating surface is constant irrespective of a variation in the temperature of the piezoelectric element. By controlling the piezoelectric displacement as described above, it is possible to avoid or minimize an otherwise possible fluctuation in the operated position of the piezoelectric actuator, which would result from the dependence of the residual strain of the actuator on the temperature.

Therefore, if the characteristic of the piezoelectric element in terms of its residual strain in relation to the temperature is known by way of measurement, the non-operated position of the operating surface of the piezoelectric element can be determined based on the actually measured temperature of the piezoelectric element. Once the non-operated position of the piezoelectric element has been determined, the required amount of displacement to the desired operated position can be determined. Since the amount of piezoelectric displacement of the piezoelectric element is proportional to the magnitude of a voltage to be applied to the piezoelectric element, the magnitude of the voltage necessary to produce the required amount of piezoelectric displacement can be obtained.

In the present driver circuit of the invention, the voltage control means determines a voltage applied to the piezoelectric element, based on an output of the temperature sensor representative of the temperature of the element, so that the determined voltage enables the operating surface of the piezoelectric element to be displaced to the predetermined operated position. The voltage control means controls the switching element such that the determined voltage is applied to the piezoelectric element. Thus, the instant driver circuit makes it possible to drive the piezoelectric element to the predetermined operated position, irrespective of the varying temperature of the piezoelectric element, which causes a variation in the amount of residual strain and non-operated position of the piezoelectric element.

The temperature sensor is adapted to measure the temperature of the piezoelectric element itself or that of a component located adjacent to the piezoelectric element, or alternatively the temperature of the ambient air surrounding the piezoelectric element.

In one form of the driver circuit of the invention, a pulse signal having a controllable duty cycle is applied to the switching element for a predetermined time duration. The voltage control means controls the duty cycle of the pulse signal, based on the temperature detected by the temperature sensor, and according to a relationship between the temperature of the piezoelectric element and the duty cycle of the pulse signal, which relationship permits the operated position of the piezoelectric element to be held constant.

In another form of the driver circuit of the invention, voltage detecting means is provided for detecting the voltage present across the piezoelectric element. The voltage control means determines a reference voltage value based on the temperature detected by the temperature sensor, and according to a relationship between the temperature of the piezoelectric element and the voltage across the piezoelectric element, which relationship permits the operated position of the piezoelectric element to be held constant. The voltage control means holds the switching element on until the voltage actually detected by the voltage detecting means coincides with the determined reference voltage.

In a further form of the instant driver circuit, integrating means is provided for obtaining an integrated value of a charging current which is applied to the piezoelectric element via the switching element. The voltage control means determines a reference value of the integrated value based on the temperature detected by the temperature sensor and according to a relationship between the temperature of the piezoelectric element and the integrated value of the charging current, which relationship permits the operated position of the piezoelectric element to be held constant. The voltage control means holds the switching element on until the integrated value actually detected by the integrating means coincides with the determined reference value.

A still further form of the instant driver circuit according to the present invention further comprising (i) a coil disposed between the switching element and the piezoelectric element, (ii) current detecting means for detecting a charging current applied to the piezoelectric element via the switching element, and (iii) voltage detecting means for detecting the voltage across the piezoelectric element. In the present arrangement, the voltage control means comprises calculating means for calculating, based on the detected charging current and the detected voltage across the piezoelectric element, a final value of the voltage which is present across the piezoelectric element after the switching element is turned off. The voltage control means further comprises means for determining a reference value of the final value, based on the temperature detected by the temperature sensor, and according to a relationship between the temperature of the piezoelectric element and the final value of the voltage across the piezoelectric element, which relationship permits the operated position of the piezoelectric element to be held constant. The voltage control means holds the switching element on until the final value calculated by the calculating means coincides with the determined reference value.

BRIEF DESCRIPTION OF THE DRAWINGS

The above and other objects, features and advantages of the present invention will become more apparent by reading the following detailed description of presently preferred embodiments of the invention, when considered in conjunction with the accompanying drawings, in which:

FIG. 4 is a graphical representation for explaining a manner of determining a voltage to be applied to the piezoelectric element of the print head in a second embodiment of the invention, based on a detected printing pressure of the print wire;

FIG. 5 is a schematic diagram showing a driver circuit for activating a piezoelectric element in a third embodiment of the invention;

FIG. 7 is a schematic diagram showing a driver circuit for activating a piezoelectric element in a fourth embodiment of the invention;

DETAILED DESCRIPTION OF THE PREFERRED EMBODIMENTS

Figure 1:
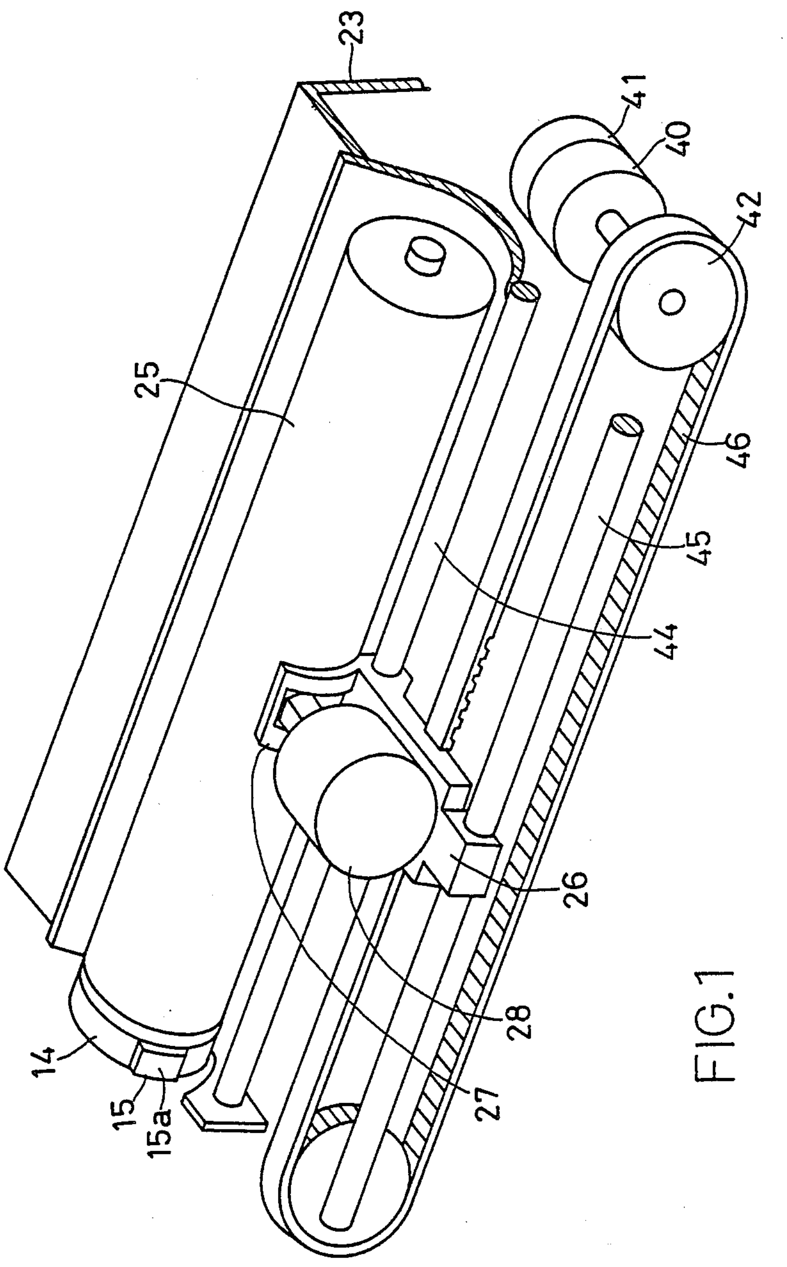
FIG. 1 is a perspective view of a printing mechanism of a printer with a dot-matrix print head having print wires activated by piezoelectric elements.
Figure 2:
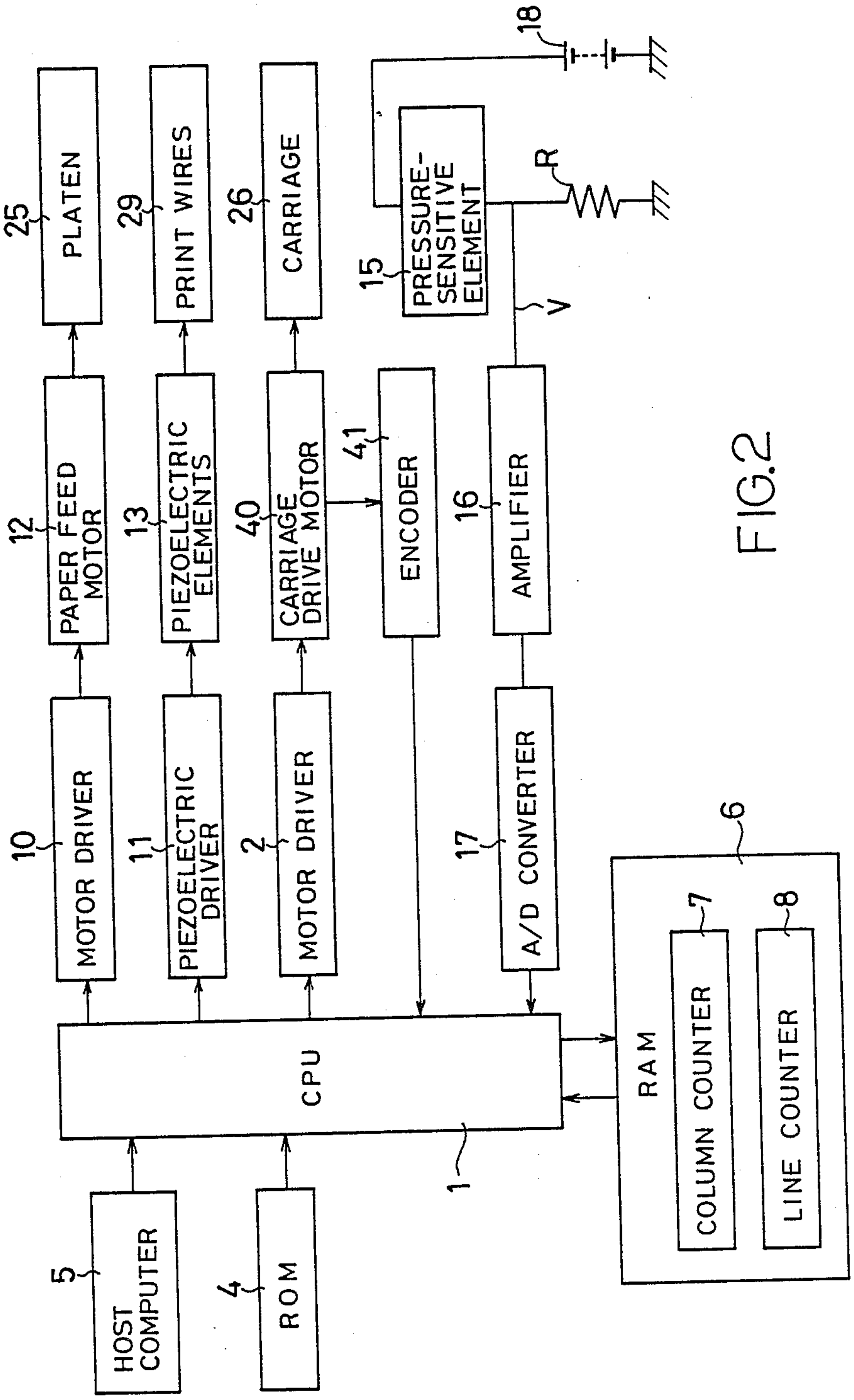
FIG. 2 is a schematic block diagram showing an electric control system of the printer according to one embodiment of the present invention.

Referring first to the perspective view of FIG. 1 and the block diagram of FIG. 2, the printing mechanism of the impact dot-matrix printer includes a carriage 26 on which are disposed a print head 28 and a paper holder 27. The print head 28 incorporates piezoelectric elements 13, an amplifying mechanism (not shown) for amplifying displacements of the piezoelectric elements 13, and print elements in the form of wires 29 which are operated by the amplified displacements of the piezoelectric elements 13 transmitted by the amplifying mechanism. The paper holder 27 is provided for guiding a sheet of paper along the circumference of a platen 25. The carriage 26 is slidably supported by guide bars 44, 45, and is moved in a horizontal direction by a belt 46, which is driven by a carriage drive motor 40 via a pulley 42. An encoder 41 is coupled with the drive motor 40, so that a rotating angle of the motor 40 is detected by the encoder 41, to detect the position of the print head 28 in a printing direction (parallel to a line of printing by the print head).

To the left of the left end of the platen 25, there is disposed a stationary cylindrical block 14 fixed to a frame 23 of the printer, such that the block 14 is co-axial with the platen 25. On the circumferential surface of the cylindrical block 14, there is retained a pressure-sensitive element 15 in the form of an arcuate rubber piece having a pressure-sensitive surface 15*a* which is substantially flush with the circumferential surface, of the platen 25. The rubber piece 15 exhibits electrical conductivity as a function of a pressure applied thereto. This pressure-sensitive element 15 is positioned in a non-printing area of the printer as distinguished from a printing area in which printing by the print head 28 is effected. As described later, the print head 28 is moved to a predetermined position within the non-print area, so that one of the print wires 29 activated by the corresponding piezoelectric element 13 may abut at its operating end on the pressure-sensitive surface 15*a*.

In the block diagram of FIG. 2 illustrating the electric control system of the printer of FIG. 1, there is shown a central processing unit (CPU) 1, to which are connected a read-only memory (ROM) 4 and a random-access memory (RAM) 6. The ROM 4 stores control programs for controlling a printing operation, and the RAM 6 is adapted to temporarily store printing data and various control data. The RAM 6 includes a column counter 7 for counting the number of print columns, i.e., storing column data indicative of the position of the carriage 26 in the horizontal or printing direction, and further includes a line counter 8 for counting the number of print lines, i.e., storing line data indicative of the position of the paper in the feeding direction.

To the CPU 1, there are also connected a motor driver 2 for driving the carriage drive motor 40, a motor driver 10 for driving a paper feed motor 12, and a piezoelectric driver 11 for driving the piezoelectric elements 13. The drive motor 40 rotates the belt 46 to reciprocate the carriage 26, while the drive motor 12 rotates the platen 25 to advance the paper. The piezoelectric elements 13 are assigned to drive the respective print wires 29, for abutting contact of their operating tips on the surface of the paper, to thereby form a dot-matrix pattern corresponding to a desired image to be printed. The rotating amount of the drive motor 40 is detected by the encoder 41, and the movement of the carriage 26 in the printing or horizontal direction is controlled based on the detected rotating amount of the motor 40.

The pressure-sensitive element 15 is connected to a DC power source 18, and a resistor R is connected to the pressure-sensitive element 15 such that the resistor R is connected in series between the power source 18 and the pressure-sensitive element 15. A voltage "V" across the resistor R is amplified by an amplifier 16, and is converted by an A/D converter 17 into a digital signal, which is applied to the CPU 1. The electrical resistance of the pressure-sensitive element 15 changes with a pressure acting on the pressure-sensitive surface 15*a*. That is, the pressure acting on the pressure-sensitive surface 15*a*, which is represented by the voltage "V", is detected by the CPU 1, based on the digital signal from the A/D converter 17.

Figure 3:
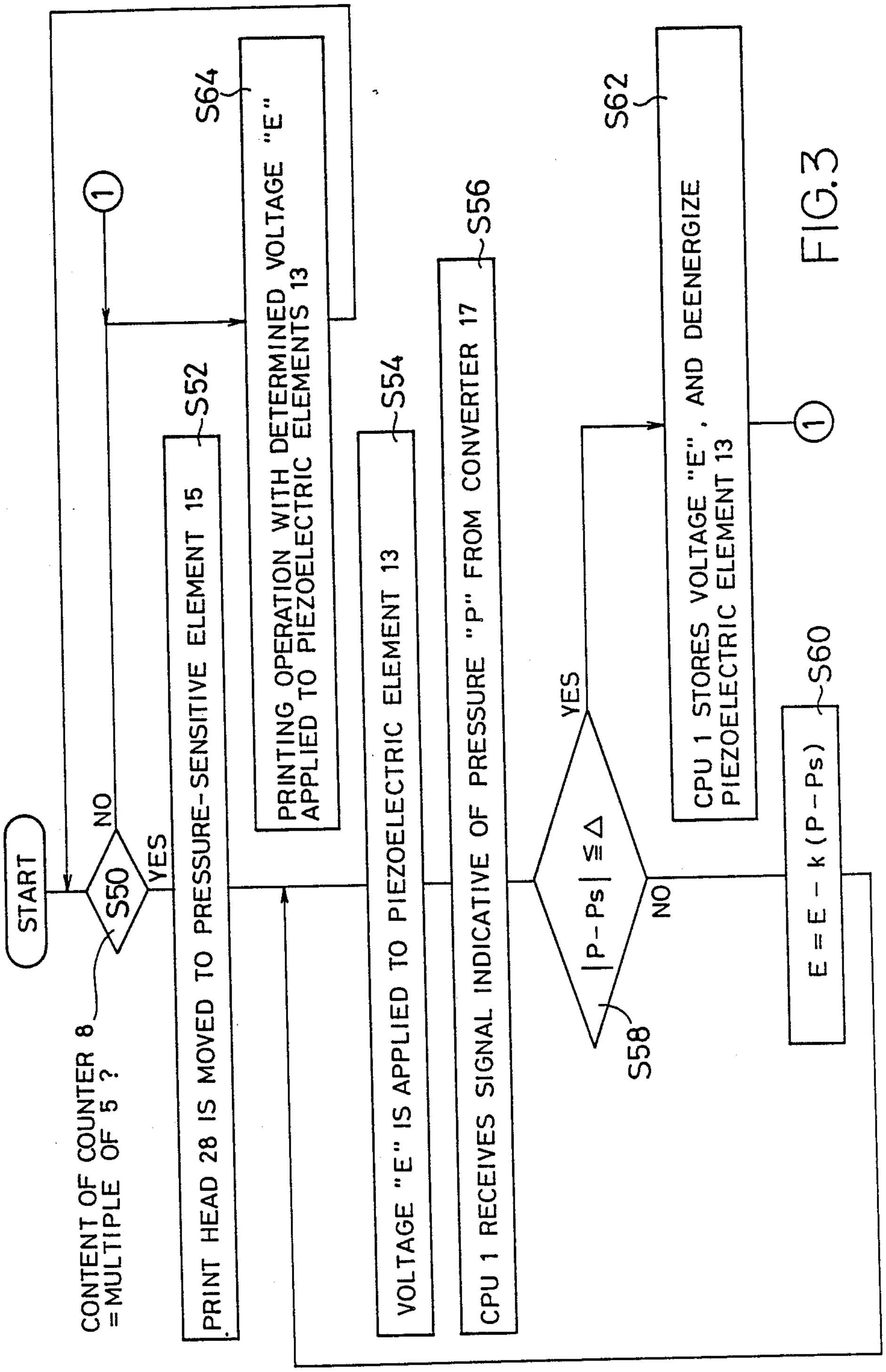
FIG. 3 is a flow chart showing a control operation executed by a CPU of the control system of FIG. 2.

An operation of the instant printer will be described by reference to the flow chart of FIG. 3.

When a command to start a printing operation is received from a host computer 5, the CPU executes step S50 to determine whether the count of the line counter 8 is a multiple of "5", i.e., whether the number of the current print line is a multiple of "5", or not. In this connection, it is noted that the line No. 0 (immediately before commencement of a printing operation) is considered as a multiple of "5". Namely, an affirmative decision is obtained in step S50 when the printing operation is started. Then, the control flow goes to step S52 and the subsequent steps, for measuring the printing pressure of the print wires 29, and adjusting the voltage to be applied to the piezoelectric elements 13 depending upon the measured printing pressure, as described below in greater detail. In the present embodiment, step S50 is executed so that the adjustment of the voltage is effected every five print lines, i.e., each time five successive lines have been printed by the print head 28.

In step S52, the print head 28 is moved with the carriage 26, by the drive motor 40, to the predetermined position in the non-printing area, in which the print head 28 is aligned with the pressure-sensitive element 15. In the next step S54, a voltage E is applied to one of the piezoelectric elements 13, so that the corresponding print wire 29 is activated, with its operating tip abutting on the pressure-sensitive surface 15*a* of the pressure-sensitive element 15, due to a displacement of the piezoelectric element 13. With the voltage E held applied to the piezoelectric element 13, the control goes to step S56 in which the CPU 1 receives a digital signal from the A/D converter 17, which indicates a pressure P detected by the pressure-sensitive element 15. Step S56 is followed by step S58 in which the CPU 1 compares the pressure P detected in step S56 with a predetermined reference pressure Ps (optimum pressure), and determines whether a difference $|P-Ps|$ is equal to or smaller than a predetermined small value Δ. If the difference $|P-Ps|$ is not equal to or smaller than the predetermined value Δ, the control flow goes to step S60 in which the voltage E is decreased by an amount which is proportional to the difference $|P-Ps|$. Then, the control flow goes back to step S54.

In step S54, the voltage E adjusted in step S60 is applied to the piezoelectric element 13. Then, the printing pressure P is again detected, in step S56, and the detected pressure P is compared with the reference value Ps in step S58. Steps S56, S58 and S60 are repeated to decrement the voltage E until an affirmative decision is obtained in step S58, that is, until the difference $|P-Ps|$ becomes equal to the predetermined small value Δ.

When an affirmative decision (YES) is obtained in step S58, the control flow goes to step S62 in which the voltage E last applied to the piezoelectric element 13 in step S54 is stored in the RAM 6, and the piezoelectric element 13 is deenergized, whereby the corresponding print wire 29 is returned to its non-operated position.

Then, the control flow goes to step S64 in which the piezoelectric elements 13 are operated to perform printing of the line in question, with the determined voltage E stored in step S62 being applied to the piezoelectric elements 13. After the printing of that line is completed, the control flow goes to step S50.

As described above, the present embodiment is adapted such that the printing pressure of the print wires 29 is detected every five print lines, and the voltage applied to the piezoelectric elements 13 is determined so that the detected printing pressure coincides with the predetermined value. The determined voltage is applied to the piezoelectric elements 13 for the next five print lines, namely, until the voltage is determined again after the next five lines are printed. Accordingly, the printing pressure of the print wires 29 can be maintained at the predetermined optimum level, even though the residual strain of the piezoelectric elements 13 or the non-operated position of the elements 13 is varied with a change in the temperature of the elements 13. To change the optimum printing pressure, a suitable switch may be provided.

In the above embodiment, the determination of the voltage applied to the piezoelectric elements 13 is accomplished by means of a feedback control wherein the actually detected printing pressure of a print wire 29 coincides with the predetermined reference or optimum value. However, the voltage that gives the optimum printing pressure may be determined based on a single measurement of the printing pressure, as indicated in FIG. 4. Since a change in the temperature of the piezoelectric elements 13 causes a corresponding change in the residual strain of the piezoelectric elements, the operated position of the corresponding print wires 29 is varied in proportion to the amount of change in the residual strain of the piezoelectric elements. Therefore, the printing pressure of the print wires 29 is varied in proportion to the amount of change in the residual strain of the piezoelectric elements 13. With a given reference voltage Es applied to the piezoelectric element, the printing pressure of the corresponding print wire is changed by an amount Δ proportional to the amount of change in the residual strain of the piezoelectric element. Assuming that a reference printing pressure Ps is established at a reference temperature with the reference voltage Es applied to the piezoelectric element, a printing pressure P established at a given temperature with the reference voltage Es applied differs from the reference printing pressure Ps, by the amount Δ (=P−Ps) which is caused by a difference between the two temperatures. Consequently, if the control system stores a standard relationship (A) between the printing pressure P and the voltage E at a reference temperature as indicated in FIG. 4, it is possible to determine a voltage E1 corresponding to a printing pressure P1 (=Ps−Δ) which is determined based on the difference Δ between the actually detected print pressure P and the reference pressure Ps, and according to the stored standard relationship (A). The determined voltage E1 applied to the piezoelectric element 13 permits the corresponding print wire 29 to produce the reference printing pressure Ps.

In the illustrated embodiment, the voltage to be applied to the piezoelectric elements 13 is determined or adjusted at the time of starting a printing operation, i.e., at print line No. 0, and every five print lines. However, the frequency of this determination or adjustment of the voltage may be suitable changed. For instance, the voltage may be determined at the time of starting the printing of each page.

Although the illustrated embodiment is adapted such that the voltage to be applied to all the piezoelectric elements 13 is determined based on the detected printing pressure of a selected one of the print wires, it is possible that the voltage to be applied to each piezoelectric element 13 may be determined based on the detected printing pressure of the corresponding piezoelectric element.

The pressure-sensitive element 15, which is positioned to the left of the platen 25 in the illustrated embodiment, may be positioned to the right of the platen 25. Further, two pressure-sensitive elements may be provided to the left and right of the platen 25, respectively. In this case, one of the two pressure-sensitive elements which is nearer to the print head 28 positioned at one of opposite ends of each print line is selectively used to detect the printing pressure of the print wire, depending upon the output of the encoder 41 which represents the position of the print head 28 in the printing direction. This arrangement permits increased printing efficiency.

Regarding the temperature of the piezoelectric elements during a printing operation, it is noted that a rise of the temperature depends from the overall duty ratio of the piezoelectric elements or print wires. In other words, the piezoelectric elements tend to be heated at a higher rate when the printing involves a comparatively large number of characters or graphical images which have a relatively high dot density. In this case, the adjustment of the printing pressure at a predetermined frequency (e.g., at the end of printing of a predetermined number of lines) may not necessarily assure a consistent printing pressure of the print wires, and may cause a variation in the concentration or density of the printed image. It is therefore preferred that the adjustment of the printing pressure based on the detected pressure level be effected each time the cumulative number of dots used for the printed characters or images has reached a predetermined value. This arrangement permits improved consistency of the printing pressure, even though the dot density of the printed matter varies from one area to another.

It is also noted that the printing speed is lowered with an increase in the dot density of the characters to be printed. In this sense, the adjustment of the printing pressure may be effected at a predetermined time interval during a printing operation.

In the case where the adjustment of the printing pressure is achieved at the end of each printing of a predetermined number of dots, or at a predetermined time interval, that predetermined number of dots or predetermined time interval may be reached while a given line is being printed. In this instance, the detection of the printing pressure for adjustment purpose may be deferred until the line involved has been printed.

Figure 6:
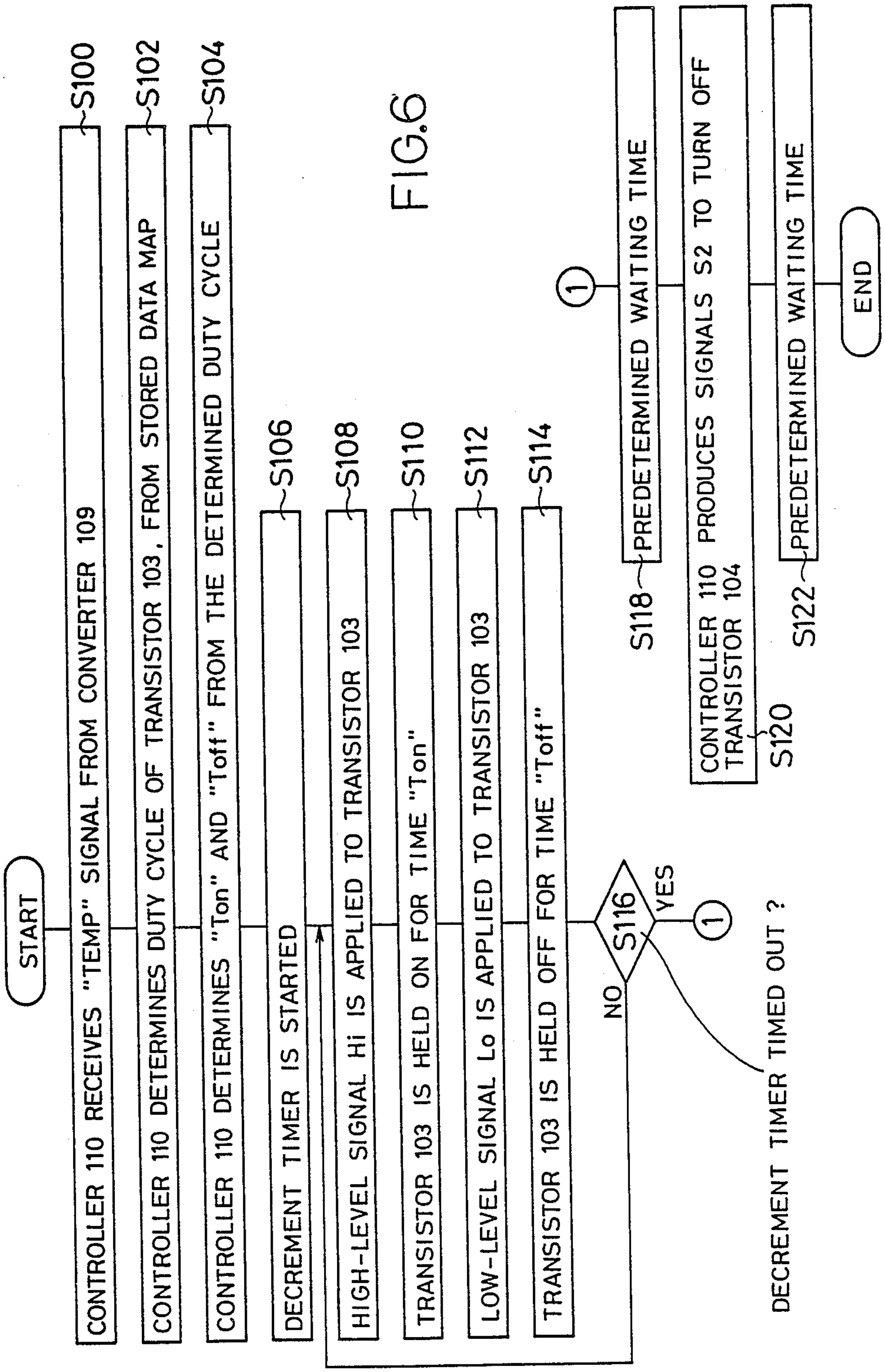
FIG. 6 is a flow chart illustrating a control operation performed by a microcomputer used in a voltage controller in the third embodiment of the invention.

Referring next to FIGS. 5 and 6, there will be described a third embodiment of the present invention, used as a driver circuit for driving a piezoelectric element for activating a given print wire of an impact dot-matrix printer as described above.

In FIG. 5, reference numerals 101, 102, 103, 104, 105, and 106 designate a DC power source, a piezoelectric element, a first and a second transistor, a coil, and a diode. The first transistor 103, coil 105 and diode 106 constitute a DC-DC converter, wherein an electric current flows from the power source 101 to the coil 105 while the transistor 103 is held on. Thus, the power supplied from the power source 101 is stored as an electromagnetic energy in the coil 105. While the transistor 103 is off, the electric current flows through the piezoelectric element 102, diode 106 and coil 105, and the energy stored in the coil 105 is stored in the piezoelectric element 102. With the transistor 103 turned on and off alternately, the piezoelectric element 102 is electrically charged such that a voltage E2 is present across the element 102, with the polarity opposite to that of a voltage E1 across the DC power source 101. Thus, the first transistor 103 serves as a switching element for the piezoelectric element 102. Since the piezoelectric element 102 is a capacitive load, the voltage E2 across the element 102 increases with time. Accordingly, the voltage E2 may be changed by controlling the duty cycle of the transistor 103, provided that the total control time of the transistor 103 is constant. The second transistor 104 is provided to discharge the energy in the piezoelectric element 102, through the coil 105, so that the piezoelectric element 102 is restored to its non-operated initial position.

In the driver circuit arranged as described above, the temperature of the piezoelectric element 102 is detected by a temperature sensor 107 disposed adjacent to the element 102. An output of the temperature sensor 107 is processed by an amplifier 108 and an A/D converter 109, and the processed signal is applied to a voltage controller 110.

The voltage controller 110 consists of a one-chip microcomputer incorporating a read-only memory which stores data representative of a standard relationship between the temperature of the piezoelectric element 102 and the duty cycle of the first transistor 103.

This relationship is determined so that the operated position of the operating surface of the piezoelectric element 102 is held constant irrespective of its temperature.

The microcomputer of the voltage controller 110 operates to perform a control operation, according to a control flow shown in FIG. 6.

Initially, the controller 110 executes step S100 to receive from the A/D converter 109 a TEMP. signal indicative of the temperature of the piezoelectric element 102. Step S100 is followed by step S102 in which the controller 110 determines a value of the duty cycle of the transistor 103 corresponding to the detected temperature of the piezoelectric element 102, according to the relationship stored in the read-only memory of the controller. The control flows then goes to step S104 to determine time spans "Ton" and "Toff" during which the transistor 103 is held on and off, respectively. Then, the control flows goes to step S106 in which a decrement timer is started. This decrement timer measures a predetermined time duration in which the transistor 103 is turned on and off by a pulse signal having the determined duty cycle, as described below.

Step S106 is followed by step S108 in which a high-level signal Hi is applied to the base of the transistor 103. In the next step S110, the time span "Ton" determined in step S104 is allowed. Namely, steps S108 and S110 are provided to hold the transistor 103 in the on state for the time span "Ton".

Then, a low-level signal Lo is applied to the transistor 103 in step S112, and the time span "Toff" determined in step S104 is allowed in step S114. Thus, steps S112 and S114 serve to hold the transistor 103 in the off state for the time span "Toff".

The control flow then goes to step S116 to determine whether the predetermined time has passed after the start of the decrement timer in step S106. If a negative decision is obtained in step S116, the control flow goes back to step S108 and the subsequent steps, in order to perform another duty cycling operation of the transistor 103. That is, the duty cycling operation is continued until the predetermined time set in the decrement timer has elapsed.

As a result of the on-off cycling operation of the transistor 103 with the determined duty cycle, the voltage E2 across the piezoelectric element 102 is adjusted to a level which corresponds to the determined value of the duty cycle of the transistor 103. Since the determined duty cycle is an optimum value which corresponds to the actually detected temperature of the piezoelectric element 102, the voltage E2 applied to the piezoelectric element 102 is adjusted depending upon the temperature of the element 102. Consequently, the operated position of the operating surface of the piezoelectric element 12 (corresponding print wire) after a displacement of the element 102 due to application of the determined voltage E2 thereto can be held constant, irrespective of the non-operated position of the element 12 which varies with its temperature. Therefore, the instant driver circuit for the piezoelectric element 102 permits improved consistency of the printing pressure of the print wire activated by the piezoelectric element 102, which accordingly enhances the printing quality obtained on the dot-matrix printer.

After the voltage has been applied to the piezoelectric element 102, the control flow goes to step S118 in which a predetermined time is provided to enable the corresponding print wire to hold its operated printing position for a sufficient time. Then, the controller 110 executes step S120 in which a control signal Lo is applied to the base of the second transistor 104, whereby the transistor 104 is turned off to discharge the electric charge of the piezoelectric element 102. Consequently, the operating surface of the piezoelectric element 102 is returned to its non-operated position. Subsequently, step S122 is executed to allow a predetermined time for permitting the piezoelectric element 102 to be perfectly restored to its non-operated position. Thus, a single impact of the print wire to form a dot on the recording medium is completed.

In the present third embodiment described above, the total control time of the transistor 103 is held constant, while the duty cycle (time spans "Ton" and "Toff") is controlled to adjust the voltage according to the temperature of the piezoelectric element 102. However, it is possible that the duty cycle is held constant, while the transistor 103 is turned on and off with the constant duty cycle until the voltage E2 across the piezoelectric element 102 which is detected by a suitable detector coincides with a reference or optimum value which corresponds to the detected temperature of the piezoelectric element 102.

Figure 8:
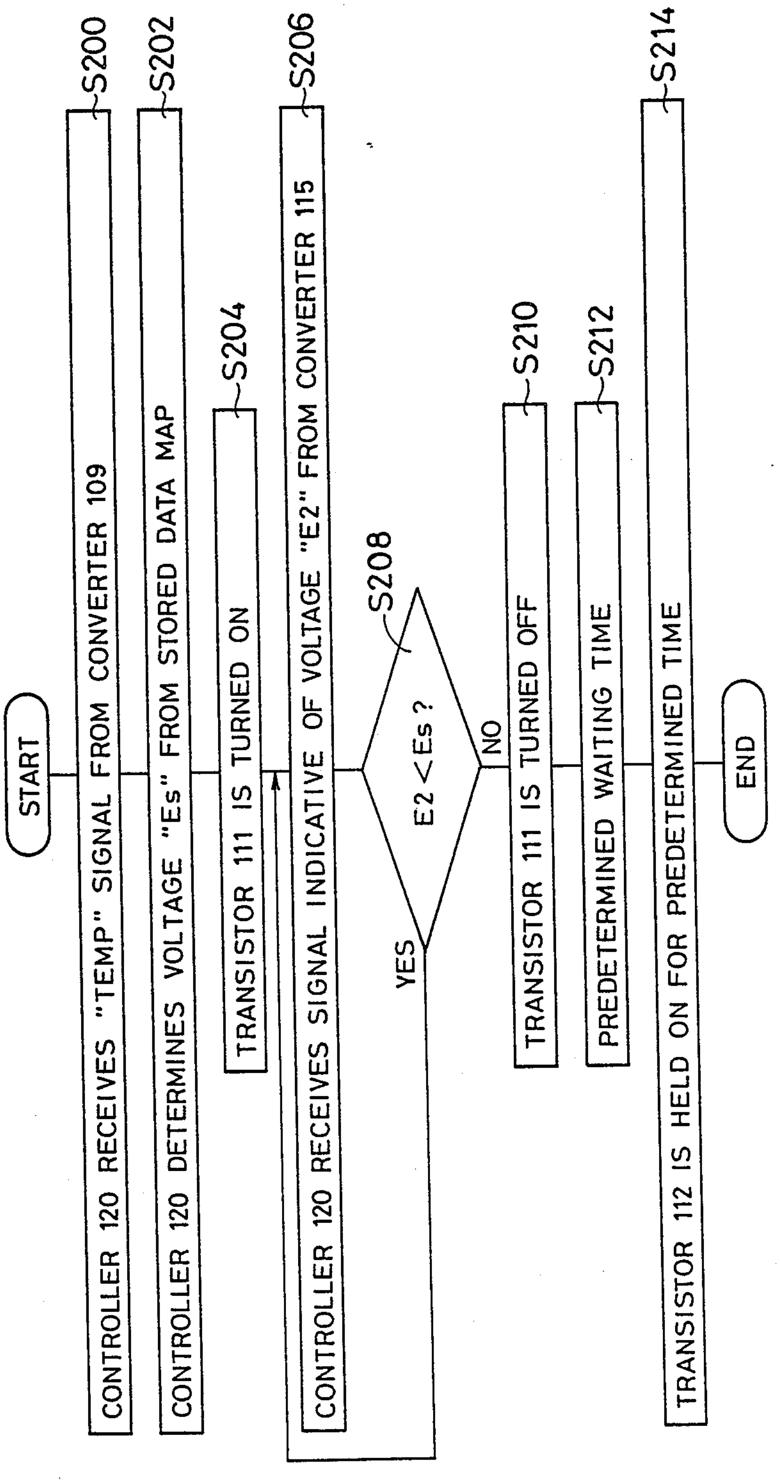
FIG. 8 a flow chart illustrating a control operation performed by a microcomputer in the fourth embodiment of the invention.

A fourth embodiment of the invention in the form of a driver circuit for the piezoelectric element 102 will be described by reference to FIGS. 7 and 8. In the present embodiment, the piezoelectric element 102 is charged by the power source 101, via a resistor 113 connected between the element 102, and a first transistor 111 connected to the power source 101. At this time, the voltage E2 across the piezoelectric element 102 is raised toward the level of the voltage E1 of the power source 101, at a rate determined by a time constant CR, which in turn is determined by an electrical resistance R of the resistor 113 and a capacitance C of the piezoelectric element 102.

Like the voltage controller 110 used in the third embodiment, a voltage controller 120 of the instant embodiment consists of a one-chip microcomputer incorporating a read-only memory. However, the read-only memory of the controller 120 stores data representative of a relationship between the temperature of the piezoelectric element 102, and the voltage to be applied to the piezoelectric element 102. This relationship is determined so that the operated position of the piezoelectric element 102 is held constant irrespective of its temperature. The microcomputer of the voltage controller 120 operates to perform a control operation, according to a control flow shown in FIG. 8.

Initially, the controller 120 executes step S200 to receive from the A/D converter 109 the TEMP. signal indicative of the detected temperature of the piezoelectric element 102. In the next step S202, the controller 120 determines a reference or target value of the voltage Es which corresponds to the detected temperature of the piezoelectric element 102, according to the relationship stored in the microcomputer. Step S202 is followed by step S204 in which the transistor 111 is turned on. Then, the control flow goes to step S206 in which the controller 120 receives from the A/D converter 115 a signal indicative of the voltage E2 present across the piezoelectric element 102. In the next step S208, the controller 120 compares the detected voltage E2 with the determined target voltage Es. If the detected voltage E2 is lower than the voltage Es, the control flow goes back to step S206 to again receive the present voltage E2, and repeat step S208 to determine whether the received voltage E2 is lower than the target voltage Es. Thus, steps S206 and S208 are repeatedly executed until the detected voltage E2 becomes equal to the target or reference voltage Es determined in step S202. If the voltage E2 becomes equal to the voltage Es, step S208 is followed by step S210 in which a predetermined time is provided to allow the corresponding print wire to be held in its operated position for a sufficient time. Then, in step S214, the second transistor 112 is turned off to discharge the energy of the piezoelectric element 102, so that the operating surface of the piezoelectric element 102 is restored to its non-operated position.

Figure 9:
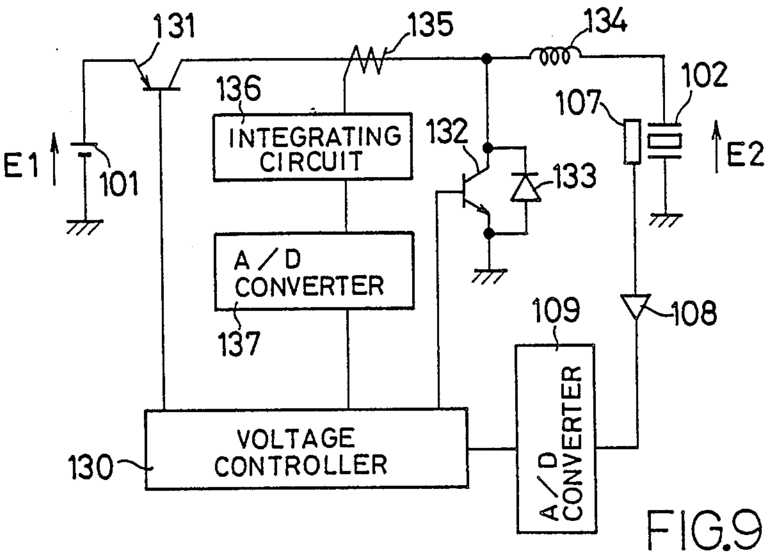
FIG. 9 is a schematic diagram showing a driver circuit for a piezoelectric element in a fifth embodiment of the invention.
Figure 10:
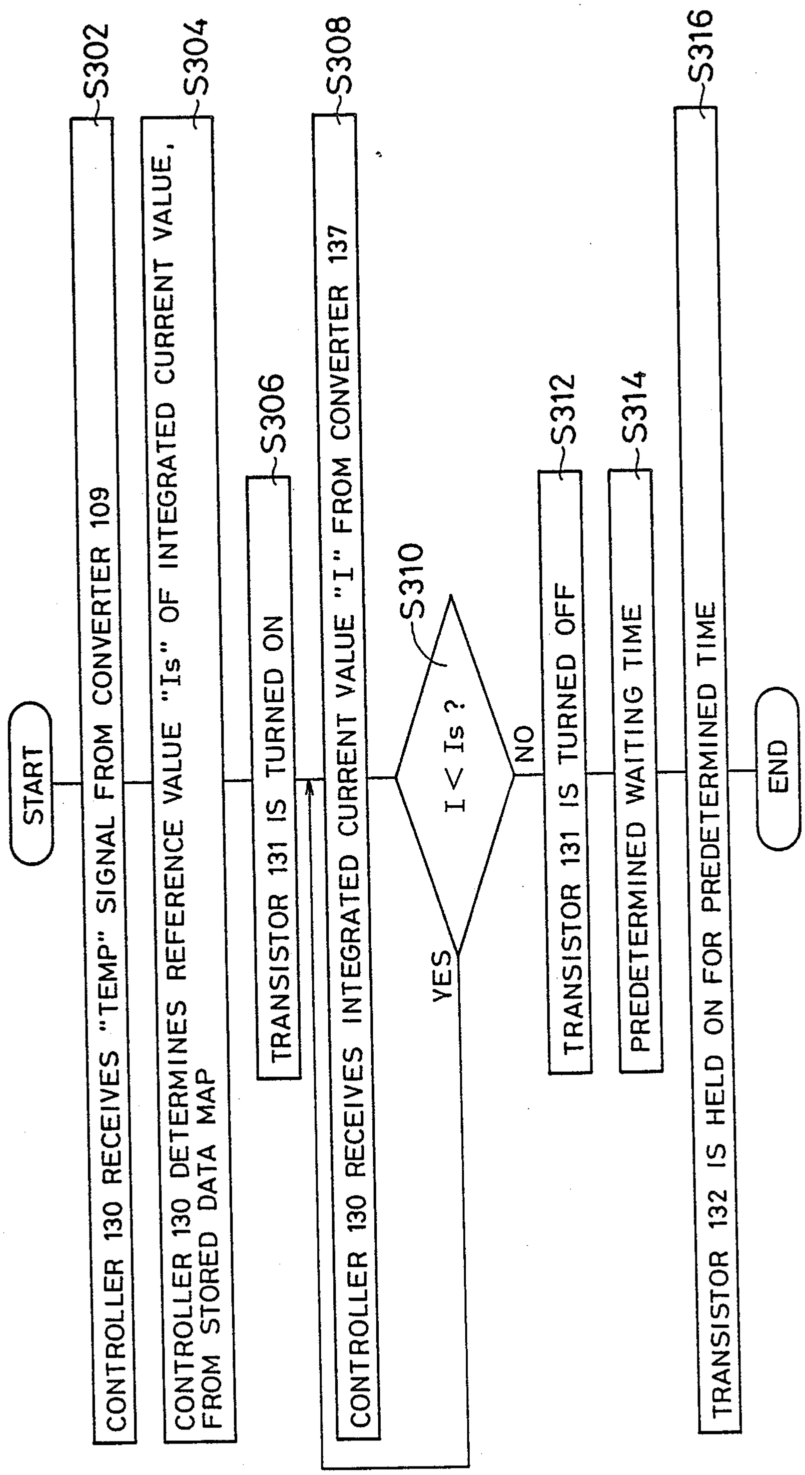
FIG. 10 is a schematic flow chart illustrating a control operation in accordance with the fifth embodiment of the operation.

Referring to FIGS. 9 and 10, a fifth embodiment of the present invention also in the form of a driver circuit for the piezoelectric element 102 will be described.

In the present modified embodiment, the piezoelectric element 102 is charged through a transistor 131 and a coil 134 while the transistor 131 is held on. When the transistor 131 is turned off, the piezoelectric element 102 is charged with an energy which is stored in the coil 134 through a diode 133. The charging current is detected by a current transformer 135, and an output of the transformer 135 is integrated by an integrating circuit 136. Thus, an integrated value "I" of the charging current is obtained. The obtained integrated current value "I" is applied to a voltage controller 130 via an A/D converter 137. The voltage E2 present across the piezoelectric element 102 after it is charged can be determined based on the integrated value "I" of the charging current. Therefore, the voltage E2 across the piezoelectric element 102 can be suitably controlled according to the temperature of the element 102, by holding the transistor 131 in the on state until the integrated value "I" of the charging current detected by the transformer 135 coincides with a reference or target value "Is" which is determined based on the detected temperature of the piezoelectric element 102, and according to a predetermined relationship between the temperature of the element 102 and the integrated current value "Is". This relationship, which is determined for consistent operated position of the piezoelectric element 102 irrespective of its temperature, is stored in a read-only memory of a microcomputer incorporated in the voltage controller 130.

More specifically described by reference to the flow chart of FIG. 10, the controller 130 receives the TEMP. signal from the A/D converter 109 in step S302, and determines in step S304 the target integrated current value "Is", based on the detected temperature and according to the relationship stored therein. Then, the control flow goes to step S306 to turn on the transistor 131, and then to step S308 in which the controller 130 receives the signal from the A/D converter 137, which indicates the integrated value "I" of the charging current. Then, step S310 is executed to determine whether the integrated value "I" is smaller than the target value "Is" or not. Steps S308 and S310 are repeatedly executed until the received integrated value "I" becomes equal to the target value "Is". Then, steps S312, S314 and S316 similar to steps S210, S212 and S214 of FIG. 8 are executed.

Figure 11:
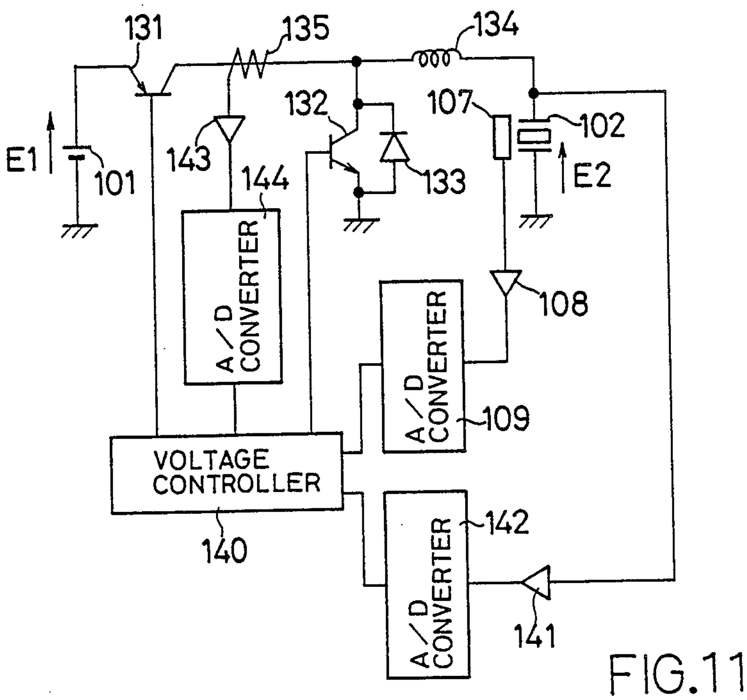
FIG. 11 is a schematic diagram showing a driver circuit for a piezoelectric element in a sixth embodiment of the invention.
Figure 12:
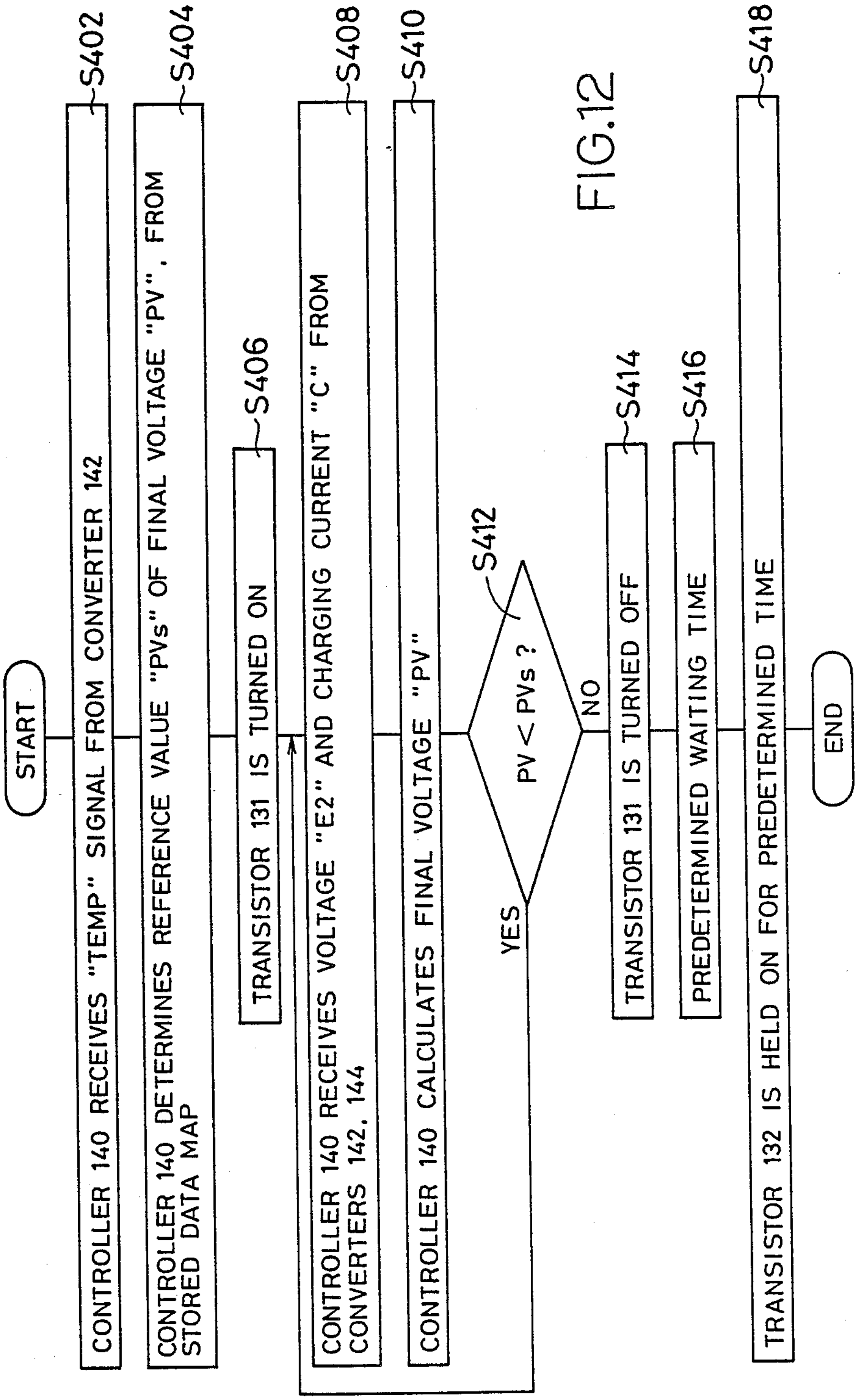
FIG. 12 is a flow chart illustrating a control operation in accordance with the sixth embodiment of the invention.

Referring to FIGS. 11 and 12, a sixth embodiment of the present invention also in the form of a driver circuit for the piezoelectric element 102 will be described.

The instant modified embodiment uses the same circuit arrangement as used in the preceding embodiment, for charging the piezoelectric element 102. However, the present embodiment uses the current transformer 135, and an amplifier 143 and an A/D converter 144, in order to detect an instantaneous value of a charging current, rather than detect the integrated current value "I" as in the preceding embodiment. Further, the voltage across the piezoelectric element 102 is detected by an amplifier 141 and an A/D converter 142. In this arrangement, the characteristic of the charging current is that of a resonance between the coil 134 and the piezoelectric element 102. Namely, the piezoelectric element 102 is charged with an energy stored in the coil 134, even after the transistor 131 is turned off. As a result, a final value PV of the voltage E2 across the piezoelectric element 102 is equal to a sum of the energy C stored in the coil 134 and the energy E2 stored piezoelectric element 102, at the very moment when the transistor 131 is turned off. These instantaneous energies can be determined, based on the detected instantaneous value of the current flowing through the coil 135, and the instantaneous value of the voltage E2 across the piezoelectric element 102, and according to the known values of inductance of the coil 135 and capacitance of the element 102.

Therefore, the controller 140 stores in its read-only memory data representative of a relationship between the temperature of the piezoelectric element 102 and the final value PV of the voltage E2 of the element 02. This relationship is also determined for consistent operated position of the piezoelectric element 102 irrespective of its temperature. A target value PVs of the final voltage value of the piezoelectric element 102 is determined based on the detected temperature of the element 102, and according to the stored relationship. The transistor 131 is held on until the final value PV of the voltage E2 (i.e., sum of the instantaneous voltage E2 of the piezoelectric element 102 and the instantaneous energy C stored in the coil 134 after the transistor 131 is off) becomes equal to the determined target value PVs. Thus, the final value PV of the voltage across the piezoelectric element 102 can be controlled depending upon the temperature of the element 102.

Described more specifically referring to the flow chart of FIG. 12, the controller 140 receives the TEMP. signal from the A/D converter 109 in step S402, and determines in step S404 the target value PVs of the final voltage E2 across the piezoelectric element 102, based on the detected temperature and according to the relationship stored therein. Then, the control flow goes to step S406 to turn on the transistor 131, and then to step S408 in which the controller 140 receives the signal from the A/D converter 144, which indicates the instantaneous value of the charging current C flowing through the coil 135, and also receives the signal from the A/D converter 142, which indicates the instantaneous value of the voltage E2 across the piezoelectric element 102. Then, step S410 is executed to calculate the final value (sum) PV of the voltage E2 of the piezoelectric element 102. The control then goes to step S412 to determine whether the calculated value PV is smaller than the target value PVs, or not. Steps S408, S410 and S412 are repeatedly executed until the detected value PV coincides with the target value PVs. Then, steps S414, S41 and S418 similar to steps S312, S314 and S316 of FIG. 10 are executed.

While the controllers 110, 120, 130 and 140 used in the preceding embodiments are formed of a one-chip microcomputer, these controllers may be replaced by a suitable circuit incorporating appropriate components which perform a function equivalent to the one-chip microcomputer.

While the present invention has been described in its presently preferred embodiments with a certain degree of particularity, it is to be understood that the invention is not limited to the details of the illustrated embodiments, but the invention may be embodied with various changes, modifications and improvements, which may occur to those skilled in the art, without departing from the scope of the invention defined in the following claims.

What is claimed is:

1. A driver circuit for driving a piezoelectric element whose amount of residual strain has a negative dependence upon a temperature thereof, comprising:

a piezoelectric element;

a DC power source and a switching element for charging said piezoelectric element in response to a control signal;

a temperature sensor for detecting a temperature of said piezoelectric element; and voltage control means for controlling said control signal applied to said switching element, according to said temperature of said piezoelectric element detected by said temperature sensor, such that a voltage applied to said piezoelectric element increases with an increase in said temperature of the piezoelectric element so that an operated position of said piezoelectric element with said voltage applied thereto is held constant, irrespective of a non-operated position of said piezoelectric element which varies with the temperature thereof, due to said negative dependence of the amount of residual strain of the piezoelectric element upon the temperature thereof.

2. A driver circuit according to claim 1, wherein said voltage control means applies said control signal in the form of a pulse signal having a controllable duty cycle, to said switching element for a predetermined time duration, said voltage control means controlling the duty cycle of said pulse signal, based on the temperature detected by said temperature sensor, and according to a relationship between the temperature of said piezoelectric element and the duty cycle of said pulse signal, which relationship permits said operated position of said piezoelectric element to be held constant.

3. A driver circuit according to claim 1, further comprising voltage detecting means for detecting said voltage present across said piezoelectric element, said voltage control means determining a reference voltage value based on the temperature detected by said temperature sensor, and according to a relationship between the temperature of said piezoelectric element and said voltage across said piezoelectric element, which relationship permits said operated position of said piezoelectric element to be held constant, said voltage control means holding said switching element on until the voltage actually detected by said voltage detecting means coincides with the determined reference voltage.

4. A driver circuit according to claim 1, further comprising integrating means for obtaining an integrated value of a charging current which is applied to said piezoelectric element via said switching element, said voltage control means determining a reference value of said integrated value based on the temperature detected by said temperature sensor and according to a relationship between the temperature of said piezoelectric element and the integrated value of said charging current, which relationship permits said operated position of said piezoelectric element to be held constant, said voltage control means holding said switching element on until the integrated value actually detected by said integrating means coincides with the determined reference value.

5. A driver circuit according to claim 1, further comprising (a) a coil disposed between said switching element and said piezoelectric element, (b) current detecting means for detecting a charging current applied to said piezoelectric element via said switching element, and (c) voltage detecting means for detecting said voltage across said piezoelectric element, and wherein said voltage control means comprises:

calculating means for calculating, based on the detected charging current and the detected voltage across said piezoelectric element, a final value of said voltage which is present across said piezoelectric element after said switching element is turned off; and means for determining a reference value of said final value, based on the temperature detected by said temperature sensor, and according to a relationship between the temperature of said piezoelectric element and said final value of said voltage across said piezoelectric element, which relationship permits said operated position of said piezoelectric element to be held constant, said voltage control means holding said switching element on until said final value calculated by said calculating means coincides with the determined reference value.

* * * * *